United States Patent [19]
Fifield

[11] 3,710,196
[45] Jan. 9, 1973

[54] CIRCUIT BOARD AND METHOD OF MAKING CIRCUIT CONNECTIONS

[76] Inventor: Thomas B. Fifield, 1535 West Dean Road, Milwaukee, Wis. 53217

[22] Filed: April 27, 1970

[21] Appl. No.: 32,024

[52] U.S. Cl. .................317/101 CC, 29/624, 29/626, 174/68.5, 35/19 A, 339/275 B
[51] Int. Cl. ...............................................H05k 1/18
[58] Field of Search....174/68.5; 317/101 B, 101 CC, 317/101 CE, 101 CM; 339/118 R, 275 B; 29/626, 624; 35/19 A

[56] References Cited

UNITED STATES PATENTS

| | | | |
|---|---|---|---|
| 3,316,619 | 5/1967 | Beelitz | 317/101 CM X |
| 3,040,213 | 6/1962 | Byer et al. | 174/68.5 X |
| 3,214,827 | 11/1965 | Phohofsky | 174/68.5 X |
| 3,396,894 | 8/1968 | Ellis | 174/68.5 |
| 3,541,222 | 11/1970 | Parks et al. | 174/68.5 |

FOREIGN PATENTS OR APPLICATIONS

| | | | |
|---|---|---|---|
| 1,143,246 | 4/1957 | France | 339/118 R |

*Primary Examiner*—Darrell L. Clay
*Attorney*—Andrus, Sceales, Starke & Sawall

[57] ABSTRACT

The top surface of a circuit board made of a dielectric material is provided with a plurality of recesses filled with mercury or a low melting point conductive alloy. The alloy is solid at room temperature and reduced to a plastic or flow condition at a temperature below the damaging temperature of the board. The board is heated to maintain the low melting point alloy in its liquid state and the component leads of the electronic and other electrical components appropriately bent to extend into the alloy. The board is then cooled such that the solder solidifies to support the components and simultaneously establish the circuit connections.

7 Claims, 4 Drawing Figures

INVENTOR.
THOMAS B. FIFIELD
BY
Andrus, Sceales, Starke & Sawall
Attorneys

CIRCUIT BOARD AND METHOD OF MAKING CIRCUIT CONNECTIONS

BACKGROUND OF THE INVENTION

In the development of electrical devices, particularly those employing electronic circuits, various forms of circuit boards have been employed. Currently, electronic circuits are mounted on a perforated circuit board to one side of which a plurality of metallic conductive strips are applied in alignment with the circuit board openings. The interconnecting conductive strips are normally a thin metal foil connected to the surface of the board by a suitable adhesive. The conductive strips are formed of a metal which is compatible with the usual high-temperature lead solder employed in the connecting of the leads of electronic components to the strips. The material of the circuit board is such that solder will not adhere to its surface. The electronic components are suitably arranged to the opposite or second side of the board and provided with interconnecting terminal leads which project through appropriate aligned perforations in the circuit board and overlying strips. The outer or terminal ends of the terminal leads project slightly from the bottom side of the board adjacent the appropriate interconnecting metal strips. The board may then be dipped in a suitable lead solder, or turned over and lead solder selectively applied to the leads and the adjacent strips at the appropriate openings to establish a desired electrical interconnection of the electronic components.

Although the perforated circuit board technique has found wide acceptance in the art, the system does have certain rather distinct disadvantages. The interconnections are made to one side of the board while the components are placed to the opposite side of the board. It is somewhat difficult to actually trace the circuit as a result of the requirement of continuously moving back and forth to the opposite sides of the board. Similarly, when it is desired to remove or replace components, or otherwise change the circuit, the worker must have access to both sides of the board. Further, he must first find the appropriate lead and through the use of a soldering iron or the like, melt the solder to release the appropriate lead. The component, however, must be removed from the opposite or top side of the board. Consequently, at the moment of removal, present boards require working from both sides of the board simultaneously. Further, the solders presently employed are generally of a lead-tin alloy which are of a relatively high melting point. When it is desired to remove or replace a component, there is considerable danger of damaging the insulation or the component as such, as well as the danger of burning the worker as a result of the high temperatures. Therefore, although the prior art perforated boards are a substantial advance over the more conventional separate interconnection of the elements and separate mounting on a suitable support or the like, the above disadvantages result in undesirable expense as well as lost time and materials.

SUMMARY OF INVENTION

The present invention is particularly directed to a circuit board apparatus which provides for the convenient and relatively inexpensive assembly and subsequent servicing and changing of electrical circuits and particularly electronic circuits and the like. Generally, in accordance with the present invention, the circuit board unit includes a base member or board which is formed of a suitable dielectric material such as a glass fiber reinforced thermoset resin or other suitable plastics and the like. The one surface of the board is provided with a plurality of recesses within which a low melting point conductive metal, such as an eutectic alloy, is held. The alloy is selected to be a solid at room and/or normal operating temperatures for the electronic components and circuit. The alloy is reduced to a plastic or flow condition, however, at a sufficiently low temperature such that the board may be heated directly to a level which will raise the temperature of the alloy to its melting point without adversely damaging the board or the electronic components.

In the initial assembly and formation of the board, the low melting point alloy may be provided in a liquid form and deposited within the heated board such that it will flow throughout the several recesses and grooves to form the desired complete filling thereof. With the board heated to maintain the low melting point alloy in its liquid state, the electronic and other components can be mounted to the grooved side of the board with the component leads appropriately bent to extend into the alloy. The board is then allowed to cool, or may be force cooled, such that the alloy will solidify forming a rigid support for the components and simultaneously establishing the appropriate electrical connections. The circuit can be repaired or revised by simply placing the circuit board on a heat source such as a suitably temperature-controlled heating plate to again melt the alloy. Once melted, the components can be readily removed, replaced or other components added as desired. The convenient and ready modification and rearrangement of the circuit makes the system particularly adapted to breadboarding of circuits in the laboratory and the like.

The circuit board of the present invention which, in essence, provides solid bars of a cast-type metal conductor, provides an improved interconnection in comparison to the adhesively attached film conductors of the prior art. It provides the advantage of having all portions of the circuit on the same side of the board, thus making it unnecessary to view both sides of the board in order to understand the circuit or to remove or replace components. Further, the lead resistance is minimized as is the interlead capacitance. The absence of adhesives will further enhance the adaptability of this circuit construction to high humidity environments.

The circuit board of the present invention can, of course, also be formed as a multiple-purpose board. Thus, the board can be formed with the array of rows and columns of equally spaced holes similar to the conventional pegboard. In accordance with the present invention, however, the holes would be only partially extended into the breadboard and not through the breadboard as in the conventional pegboard and would be filled with a low melting point alloy or even with mercury. The leads of electronic components could then be placed in convenient holes on the board and all final connections made between leads by connecting two or more holes together with lengths of wire. The outermost rows or column of openings to the opposite sides of the array may be interconnected with grooves filled with low melting point alloy so as to provide a pair of common bus bars for the usual connection of an incoming power supply and a ground.

The present invention thus provides a highly improved circuit board apparatus and a method employing such a circuit board for interconnecting and joining of circuit components.

BRIEF DESCRIPTION OF DRAWING

The drawing furnished herewith illustrates the best mode presently contemplated by the inventor of carrying out the subject invention, disclosing the above advantages and features as well as others which will be readily understood from the following description of the illustrated embodiments.

In the drawing.

DESCRIPTION OF ILLUSTRATED EMBODIMENT

Figure 1:
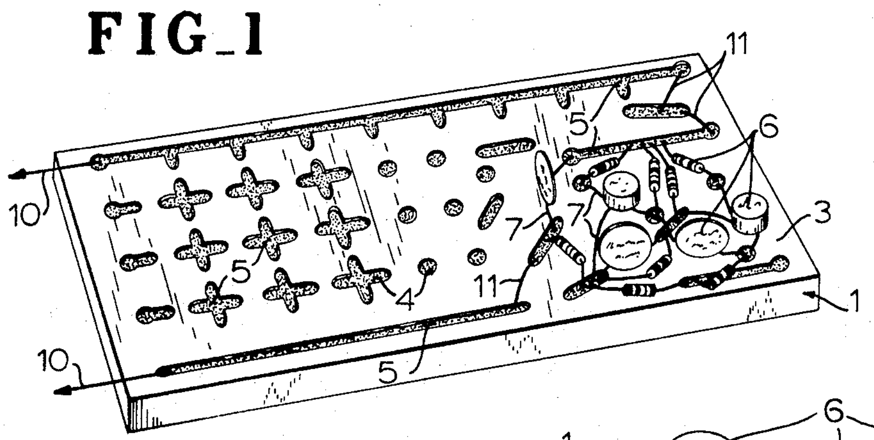
FIG. 1 is a pictorial view of a circuit board constructed in accordance with the present invention.
Figure 2:
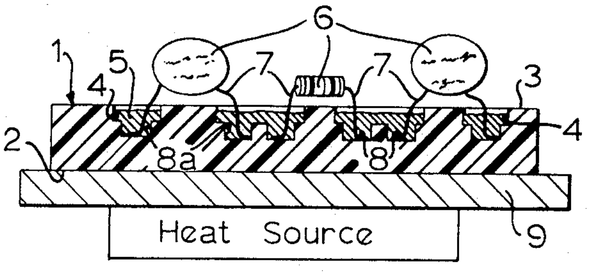
FIG. 2 is a vertical cross section of the circuit board shown in FIG. 1 mounted on a suitable heating means.

Referring to the drawing and particularly to FIGS. 1 and 2, the present invention is illustrated including a flat, rectangular board 1 having a flat planar bottom wall 2 and a flat planar top wall 3. The top wall 3 is provided with a plurality of recesses 4 of different configurations and orientation in the illustrated embodiment of the invention for purposes of clearly illustrating the versatility of the present invention. The recesses 4 are filled with a conductive metal alloy 5 to provide low resistance paths within the recesses 4. Various electrical and electronic components 6 such as resistors, capacitors, and solid-state elements such as transistors, diodes, and the like are provided with depending leads 7 which project into the recesses and particularly into the conductive metal alloy 5 with the terminal ends embedded therein and forming a firm, positive electrical interconnection therebetween. When necessary, interconnection between recesses can be made by means of a length of wire 11 with ends bent so as to project into the conductive metal alloy 5 within the recesses 4. In this manner, the several components are interconnected to a desired interrelated circuit configuration and are directly supported by the alloy 5.

In accordance with the present invention, the plate or board 1 is formed as a relatively thick member having a depth substantially greater than the depth of the recesses 4. The board is formed of a suitable insulating and dielectric material such as a Fiberglass reinforced thermosetting resin, a bakelite or other similar material which may be readily mechanically worked to form the recesses by molding, machining or other suitable process. The material of the board 1 is also selected with a relatively good thermal conductivity to permit transmitting of heat from the underside of the board to the recesses 4 and, in particular, to the conductive metal alloy 5 within the recesses.

In accordance with the present invention, the conductive metal alloy 5 is selected as a low melting point alloy such as an alloy consisting of 50.1 percent bismuth, 26.6 per cent lead, 13.3 per cent tin and 10.0 per cent cadmium. Such material will melt at a temperature of approximately 70° centigrade which is below the melting or combustion temperature of the circuit board 1. A thermoset resin board may be readily heated to establish this temperature at the recesses 4 and thereby provide for the controlled melting of the alloy 5 to the desired liquid or plastic state.

In the broadest aspects of the present invention, the recesses can be filled with mercury or the like which will maintain its molten state while permitting ready insertion and removal of the electrical leads of the components and still maintain a physical support therefor. As a practical consideration, the medium employed in the recesses should have a melting temperature of less than 100° centigrade so as to avoid heating the electronic components to a temperature that might damage them.

The circuit components 6 are formed with the leads 7 depending downwardly in accordance with a preselected and coordinated spacing of the recesses 4 and of the leads 7 such that the lower ends project downwardly into the recesses 4. The lower ends of the leads 7 may be offset or bent as at 8 to provide increased contact area and a greater physical support, if so desired. Further, location and arrangement of the lead 7 is facilitated by providing the base of the elongated recesses 4 at selected locations with one or more inner cylindrical depressions or wells 8*a* into which the leads 7 may project, thus determining their location on the board.

In assembly, the board 1 is heated to the necessary temperature to hold the alloy 5 in the plastic or liquid state. The circuit components 6 are then arranged with the leads 7 depending downwardly and supported by the plastic alloy 5. For example, the board 1 may be placed on a suitably heated plate 9 connected to any suitable heat source to define a thermostatically controlled hot plate. The heat source, for example, may be an electrical source to energize the plate or a separate source of heat such as gas or the like with the plate acting as a heat-distributing member to apply heat over the undersurface of the board 1 and thereby raise the temperature of the alloy 5 within the recesses 4. Obviously, if only a portion of the board is to be worked with, only that portion of the board 1 need be heated directly and, consequently, the aligned and closely adjacent alloy 5 will melt. The corresponding electrical components in that area can then be replaced or removed or other components added.

After the assembly, replacement or modification of the electrical components 6 with respect to the recesses 4, the board 1 is removed from the heat plate 9 and allowed to cool. The alloy 5 again congeals, providing a firm and rigid physical support of the components 6 as well as providing the desired electrical interconnection. Furthermore, the interconnection of the components in the form of essentially solid cast bar members minimizes contact resistance and intercircuit connecting resistance.

The arrangement of the recesses and their configuration may, of course, take any desired pattern in accordance with the particular application requirements. For example, in FIG. 1, the outermost recesses 4 along the longest side of the rectangular board 1 are formed as longitudinal grooves which extend essentially the length of the board and may conveniently provide connection to a pair of main incoming power leads 10. The several input connections are then made from these buses to the appropriate circuit components, the opposite ends of which are placed in other recesses.

Further, as shown in FIG. 1, the recesses may be of various shapes and configurations. Thus, at one end, a plurality of cross-shaped recesses are shown. Immediately adjacent thereto, a plurality of columns and rows of small round recesses are provided similar to the arrangement of a pegboard. At the opposite end of the board, the recesses are shown of varying lengths and random placement for purposes of illustration.

Figure 3:
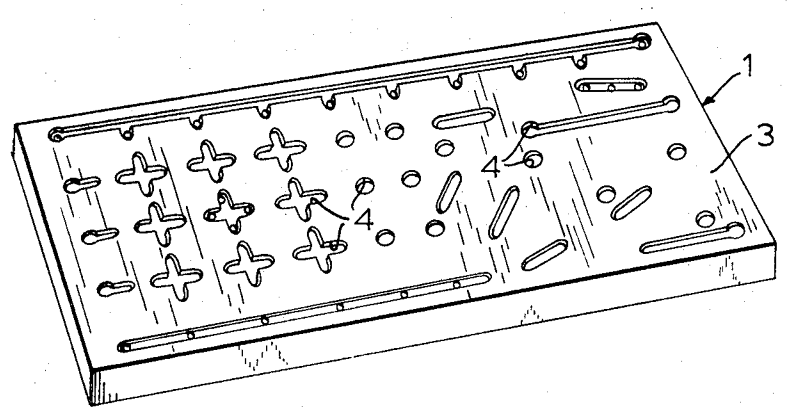
FIG. 3 is a view similar to FIG. 1 showing the circuit board without the components or interconnecting conductive alloy.

Further, a duplicate circuit board without the alloy can be formed as in FIG. 3 and employed to assemble and preform the terminal leads of the component. Thus, the leads can be cut and bent to fit into the proper holes and recesses of the duplicate board and subsequently transferred into the final board. If desired, the components can be left in the duplicate board for a subsequent, exceptionally quick, easy and relatively simple assembly by assemblers of minimum skill. Thus, if the components are arranged and placed in the duplicate board, they can be subsequently checked to make sure that they are all correctly positioned. An alloy-filled board is then oriented in the same manner and heated until the alloy has melted to the molten state. The components are then transferred, one by one, from the recesses of the duplicate board to the corresponding location in the final board.

As previously noted, the circuit board is particularly adapted to breadboarding in the laboratory and the like where it is desired to modify and rearrange and to add and subtract components a great number of times. For such a purpose, it is possible to fill the recesses with mercury instead of a higher melting point alloy, thus allowing the components to be inserted, removed and rearranged at room temperature. Placement and connection of the components to the one side of the board will, therefore, be particularly desirable while minimizing the time required to modify an experimental circuit as well as minimizing the destruction of the breadboard and the components employed.

Figure 4:
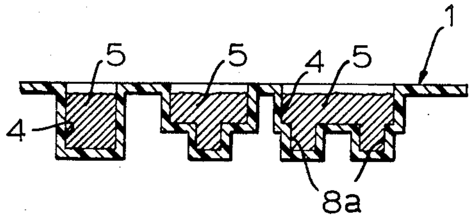
FIG. 4 is a fragmentary view similar to FIG. 2 illustrating an alternative circuit board construction.

The circuit board may be formed as shown in FIGS. 1–3 or may alternatively be formed as a molded member such as shown in FIG. 4. In FIG. 4, the several recesses are formed with walls of corresponding thickness, such that the underside of the board conforms to the recesses. Although the underside may be shaped as desired, the bottom walls of the several recesses are preferably coplanar to permit convenient heating of the alloy 5 therein.

The present invention thus provides a highly improved circuit board technique and apparatus for forming electrical circuit interconnections.

I claim:

1. A circuit board apparatus for interconnection of electrical conductors, comprising a circuit board formed of a dielectric material, said board having an upper surface with a plurality of upwardly opening recesses spaced laterally and longitudinally from each other within said upper surface and each of said recesses having a continuous bottom support wall and an exposed top opening to provide for circuit connections, and a low melting point conductive medium in said recesses, said conductive medium being in a normal solid state, electrical conductors extending into the conductive medium of selected recesses, the melting point of said medium being less than the temperature of melting or combustion of said circuit board whereby said circuit board is directly heatable to melt the medium without essential deformation of said recesses for insertion therein and removal therefrom of electrical conductors through said top openings, said conductive medium in the solid state adhering to said electrical conductors and establishing a direct firm physical and electrical connection to the conductors.

2. The circuit board apparatus of claim 1 wherein said board is a solid board having parallel top and bottom planar surfaces with said recesses formed in the upper one of said planar surfaces, the thickness of said board being selected to establish rapid transfer of heat from the second of said surfaces to said recesses for heating said conductive medium.

3. The circuit board apparatus of claim 2 wherein said recesses include a pair of parallel grooves extending the length of the board with the conductive medium defining a pair of common bus bars.

4. The board apparatus of claim 1 wherein said medium is a low melting point alloy.

5. The board apparatus of claim 1 wherein selected recesses include small wells in the bottom receiving the conductors.

6. The circuit board apparatus of claim 1 wherein said circuit board is a solid and flat plate having said plurality of recesses in one of the flat walls, said circuit board being adapted to have a selected normal operating temperature, said conductive medium consisting of a low melting point alloy which solidifies at a temperature below said normal operating temperature.

7. The circuit board apparatus of claim 1 wherein said circuit board is a molded member having a bottom wall generally conforming to the bottom configuration of the recesses.

* * * * *